(12) United States Patent
Abdulla

(10) Patent No.: US 10,128,916 B2
(45) Date of Patent: Nov. 13, 2018

(54) WIRELESS COMMUNICATION LINK USING NEAR FIELD COUPLING

(71) Applicant: Micron Technology, Inc., Boise, ID (US)

(72) Inventor: Mostafa Naguib Abdulla, Rancho Cordova, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/069,813

(22) Filed: Mar. 14, 2016

(65) Prior Publication Data

US 2016/0197653 A1  Jul. 7, 2016

Related U.S. Application Data

(63) Continuation of application No. 12/635,961, filed on Dec. 11, 2009, now Pat. No. 9,401,745.

(51) Int. Cl.
| | | |
|---|---|---|
| *H04B 5/00* | (2006.01) |
| *H04B 5/02* | (2006.01) |
| *H01Q 7/00* | (2006.01) |
| *H01L 25/065* | (2006.01) |
| *H01L 23/66* | (2006.01) |
| *H01L 23/00* | (2006.01) |
| *H01Q 23/00* | (2006.01) |
| *G11C 5/04* | (2006.01) |

(52) U.S. Cl.
CPC .............. *H04B 5/02* (2013.01); *H01L 23/66* (2013.01); *H01L 24/48* (2013.01); *H01L 25/0655* (2013.01); *H01Q 7/00* (2013.01); *H01Q 7/005* (2013.01); *H01Q 23/00* (2013.01); *H04B 5/00* (2013.01); *H04B 5/0031* (2013.01); *H04B 5/0081* (2013.01); *G11C 5/04* (2013.01); *H01L 2223/6611* (2013.01); *H01L 2223/6677* (2013.01); *H01L 2224/48245* (2013.01); *H01L 2924/00014* (2013.01); *H01L 2924/1434* (2013.01)

(58) Field of Classification Search
CPC ............. H04B 5/02; H01L 23/66; H01Q 7/00
USPC ..................... 455/41.1, 41.2, 41.3
See application file for complete search history.

(56) References Cited

U.S. PATENT DOCUMENTS

| | | | |
|---|---|---|---|
| 5,072,222 A * | 12/1991 | Fockens | G01S 13/758 342/42 |
| 5,621,913 A | 4/1997 | Tuttle et al. | |
| 5,727,972 A | 3/1998 | Aldous et al. | |
| 5,754,948 A * | 5/1998 | Metze | H04B 7/00 455/41.2 |
| 5,872,542 A * | 2/1999 | Simons | H01Q 1/1271 343/700 MS |
| 5,966,641 A * | 10/1999 | Flowerdew | H01Q 7/00 343/867 |
| 6,396,449 B1 | 5/2002 | Osterhues et al. | |
| 6,864,848 B2 | 3/2005 | Sievenpiper et al. | |
| 7,068,234 B2 | 6/2006 | Sievenpiper | |
| 7,088,964 B2 | 8/2006 | O | |
| 7,617,342 B2 | 11/2009 | Rofougaran | |
| 7,876,284 B2 * | 1/2011 | Mizoroki | G06K 19/07749 343/742 |

(Continued)

*Primary Examiner* — Md Talukder
(74) *Attorney, Agent, or Firm* — Dorsey & Whitney LLP

(57) ABSTRACT

A memory device may include an array of closely spaced memory integrated circuits that communicate wirelessly over at least two frequencies using near field coupling.

19 Claims, 3 Drawing Sheets

(56) References Cited

U.S. PATENT DOCUMENTS

| | | | |
|---|---|---|---|
| 7,969,367 B2* | 6/2011 | Mauksch | G01R 29/0871 343/703 |
| 9,331,378 B2* | 5/2016 | Merlin | H01Q 1/2225 |
| 9,401,745 B1* | 7/2016 | Abdulla | H04B 5/00 |
| 2002/0063658 A1* | 5/2002 | Washiro | H01Q 1/36 343/700 MS |
| 2003/0201941 A1* | 10/2003 | Aikawa | H01Q 13/106 343/700 MS |
| 2004/0041732 A1* | 3/2004 | Aikawa | H01Q 9/0457 343/700 MS |
| 2004/0066195 A1* | 4/2004 | Reykowski | G01R 33/3415 324/319 |
| 2004/0124248 A1* | 7/2004 | Selker | G06K 19/0716 235/492 |
| 2004/0201524 A1* | 10/2004 | Yuanzhu | H01P 1/38 343/700 MS |
| 2005/0122265 A1* | 6/2005 | Gaucher | H01Q 1/38 343/700 MS |
| 2006/0071794 A1 | 4/2006 | Sayers et al. | |
| 2006/0211380 A1 | 9/2006 | McConnell | |
| 2007/0136537 A1 | 6/2007 | Doblar et al. | |
| 2008/0115006 A1 | 5/2008 | Smith et al. | |
| 2008/0150111 A1 | 6/2008 | Hiller et al. | |
| 2008/0248802 A1 | 10/2008 | Krishnamoorthy | |
| 2008/0272972 A1 | 11/2008 | Kanno et al. | |
| 2008/0318524 A1 | 12/2008 | Rofougaran | |
| 2009/0085223 A1 | 4/2009 | Nishiyama et al. | |
| 2009/0117855 A1* | 5/2009 | Rofougaran | H01L 23/66 455/73 |
| 2009/0143038 A1* | 6/2009 | Saito | H01Q 1/007 455/272 |
| 2009/0153428 A1* | 6/2009 | Rofougaran | H01L 23/66 343/787 |
| 2009/0195469 A1 | 8/2009 | Lim et al. | |
| 2009/0231225 A1 | 9/2009 | Choudhury et al. | |
| 2009/0243813 A1 | 10/2009 | Smith et al. | |
| 2009/0267848 A1 | 10/2009 | Kuroda | |
| 2009/0322643 A1 | 12/2009 | Choudhury | |
| 2010/0026601 A1* | 2/2010 | Chang | H01L 23/585 343/834 |
| 2010/0054072 A1 | 3/2010 | Stansfield | |
| 2010/0109141 A1 | 5/2010 | Nishiyama et al. | |
| 2010/0121994 A1 | 5/2010 | Kim et al. | |
| 2010/0134376 A1* | 6/2010 | Margomenos | H01P 5/028 343/848 |
| 2010/0225323 A1* | 9/2010 | Tabarovsky | G01V 3/28 324/341 |
| 2010/0238693 A1 | 9/2010 | Jeddeloh | |
| 2010/0253572 A1 | 10/2010 | Hardacker et al. | |
| 2010/0328047 A1 | 12/2010 | Jantunen et al. | |
| 2011/0040909 A1* | 2/2011 | Abdulla | G11C 5/02 710/71 |
| 2011/0095864 A1* | 4/2011 | Trueeb | G01N 35/00732 340/10.1 |
| 2011/0140981 A1* | 6/2011 | Yukimoto | H01Q 1/3241 343/848 |
| 2011/0255352 A1 | 10/2011 | Kuroda | |
| 2012/0290760 A1 | 11/2012 | McCormack et al. | |
| 2013/0009848 A1 | 1/2013 | Plettemeier et al. | |
| 2013/0031315 A1 | 1/2013 | Abdulla et al. | |
| 2013/0091312 A1 | 4/2013 | Ken et al. | |
| 2013/0093422 A1* | 4/2013 | Morys | G01V 3/32 324/303 |
| 2013/0182513 A1 | 6/2013 | Eom et al. | |
| 2013/0183897 A1* | 7/2013 | Cordier | G06F 1/1698 455/41.1 |
| 2013/0183903 A1 | 7/2013 | McCormack et al. | |
| 2014/0008447 A1 | 1/2014 | Deavours et al. | |
| 2016/0197653 A1* | 7/2016 | Abdulla | H04B 5/00 257/421 |

\* cited by examiner

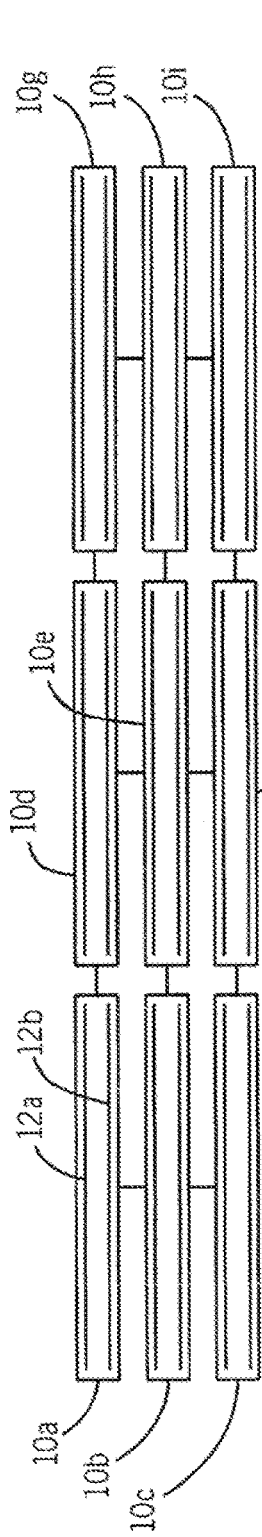
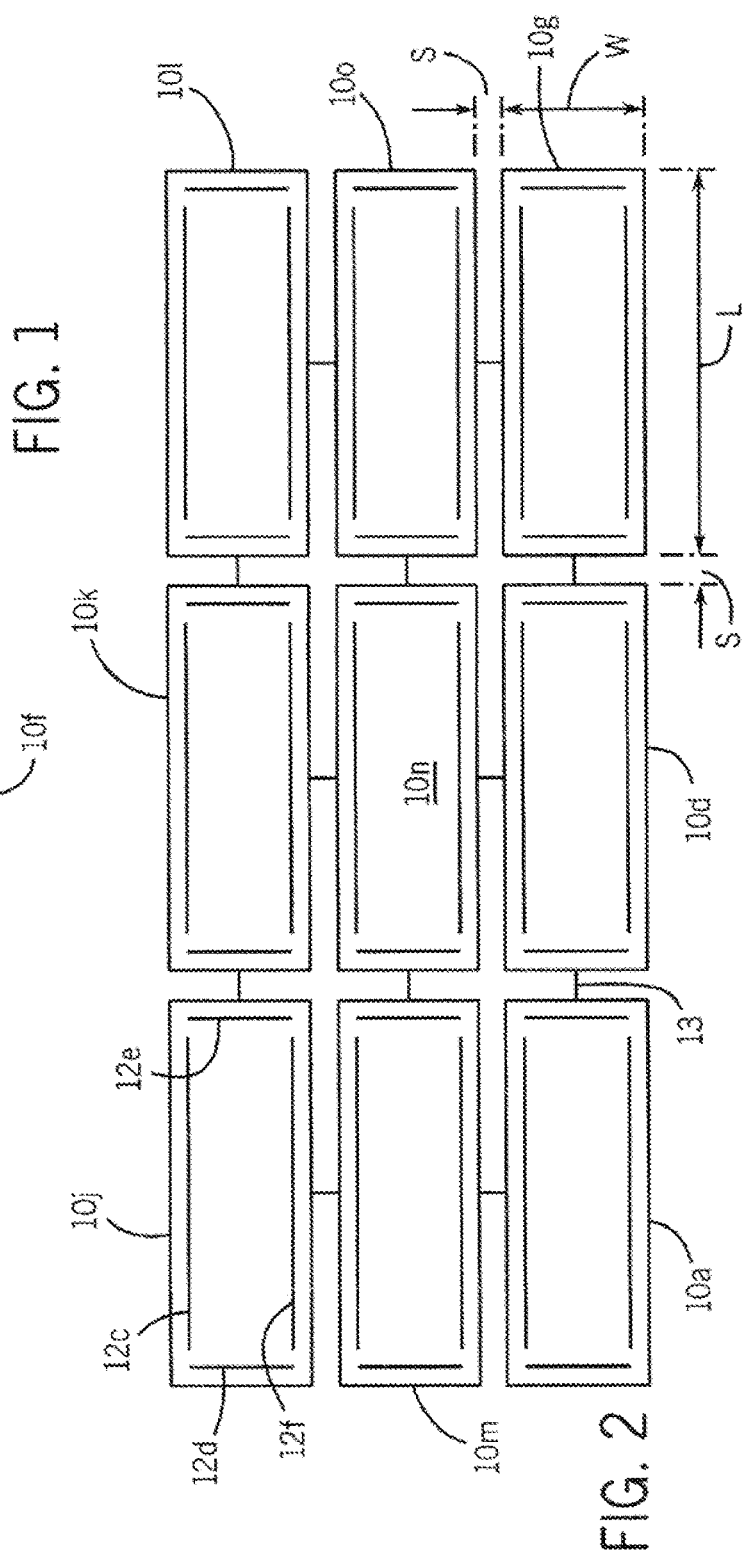

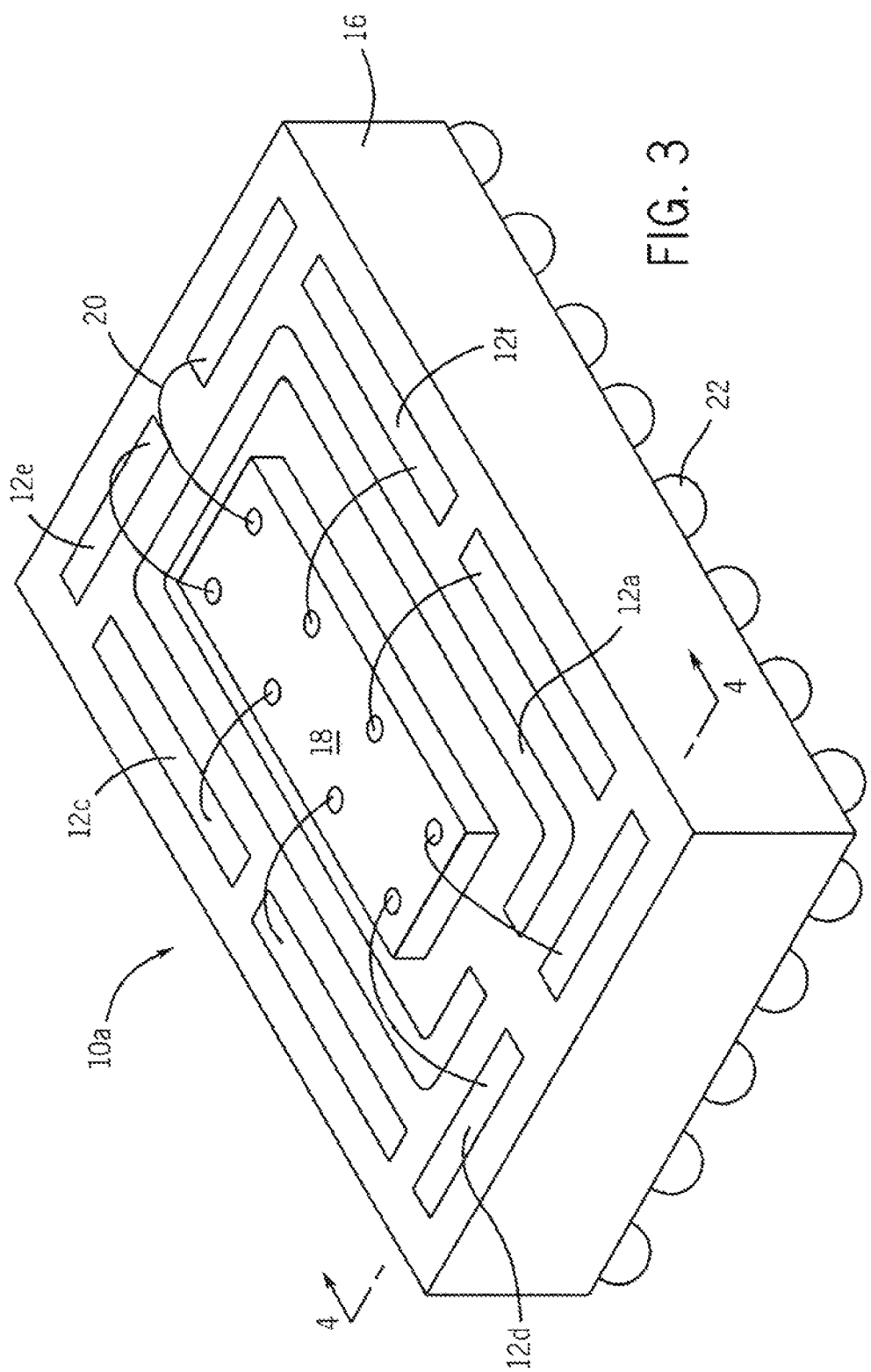

WIRELESS COMMUNICATION LINK USING NEAR FIELD COUPLING

CROSS-REFERENCE TO RELATED APPLICATION(S)

This application is a continuation of U.S. patent application Ser. No. 12/635,961, entitled WIRELESS COMMUNICATION LINK USING NEAR FIELD COUPLING, filed Dec. 11, 2009, and issued as U.S. Pat. No. 9,401,745 on Jul. 26, 2016. The afore-mentioned application and patent are incorporated by reference herein, in their entirety, and for all purposes.

BACKGROUND

With current demand for high density memory, die stacking technology is one solution to achieve a desired density. However, die stacking places many devices in parallel, which produces a capacitive loading effect that adversely reduces the bus bandwidth and limits the amount of data that can be transferred through a data link. There is a need for a viable solution that provides high density without reducing the maximum allowable data rate on a bus due to loading.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 1 is a side elevation view of a stack of memory integrated circuit in accordance with one embodiment of the present invention;

FIG. 2 is a top plan view of the embodiment shown in FIG. 1 in accordance with one embodiment of the present invention;

FIG. 3 is a perspective view of one memory chip in accordance with one embodiment of the present invention;

Figure 4:
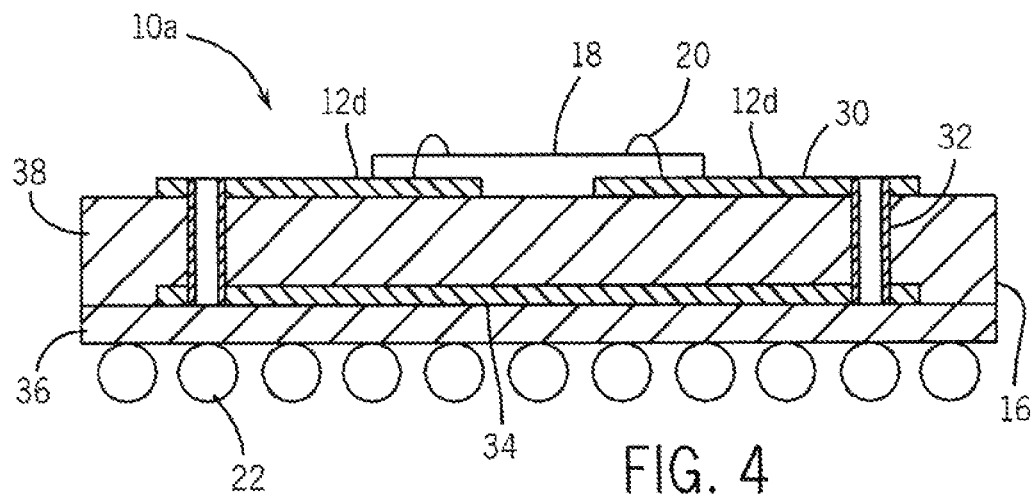
FIG. 4 is a cross-sectional view taken generally along the line 4-4 in FIG. 3.

It will be appreciated that for simplicity and clarity of illustration, elements illustrated in the figures have not necessarily been drawn to scale. For example, the dimensions of some of the elements may be exaggerated, relative to other elements, for clarity. Further, where considered appropriate, reference numerals have been repeated among the figures to indicate corresponding or analogous elements

DETAILED DESCRIPTION

In the following detailed description, numerous specific details are set forth in order to provide a thorough understanding of the invention. However, it will be understood by those skilled in the art that the present invention may be practiced without the specific details. In other instances, well known methods, procedures, components and circuits have not been described in detail so as not to obscure the present invention.

Use of the terms "coupled" and "connected", along with their derivatives, are not intended as synonyms for each other. Rather, in particular embodiments, "connected" may be used to indicate that two or more elements are in direct physical or electrical contact with each other. "Coupled" may be used to indicate that two or more elements are either in direct or indirect (with other intervening elements between them) physical or electrical contact with each other, and/or that the two or more elements cooperate or interact with each other (e.g. as in a cause and effect relationship).

An array of memory elements, shown in FIG. 1, may include a 3×3×3 array of memory integrated circuits. However, any size of array may be produced. Moreover, the height, depth, and length of the array does not have to be equal in all cases. The array may be planar rather than three dimensional or may be a single stack of a plurality of circuits.

In some embodiments, the array may itself be a packaged or molded unit that can be secured to a circuit board as one integrated element. In other embodiments, it may be built up from pieces on a substrate.

In the embodiment illustrated in FIG. 1, the 3×3×3 array includes memory integrated circuits 10a-10i. Each of these circuits may be coupled electrically to each of at least two neighbors in one embodiment. As depicted, each memory integrated circuit 10 also includes an upper loop antenna 12a and a lower loop antenna 12b. The upper loop antenna 12a couples with an overlying loop antenna 12b in an overlying memory chip, while the lower loop antenna 12b couples with an underlying memory element having an adjacent loop antenna 12a.

In some embodiments, the coupling may be near field coupling. The near field coupling may be tuned to the spacing or distance between adjacent face-to-face abutted memory elements to reduce interference. In some embodiments, the distance between adjacent or neighboring near field coupled memory integrated circuits is much smaller than dimensions of individual memory circuits. For example, the distance between near field coupled antennas may be on the order of about one millimeter, in one embodiment, whereas dimensions of the integrated circuit packages may be on the order of ten millimeters or greater in one non-limiting example.

By tuning the antennas in the associated receiving and transmitting circuits to the near field range that corresponds to the distance between integrated circuits, interference with other transversely oriented antennas and more widely spaced antennas associated with distant memory integrated circuits may be reduced in some embodiments. Generally, sufficient coupling will only be present between parallelly aligned loop antennas or, particularly, in the case where each of the loop antennas lies generally in a plane, where the planes of closely adjacent loop antennas are generally parallel. This, too, greatly reduces interference since transverse antennas lying in transverse planes will not significantly affect communications between closely spaced antennas in substantially parallel planes, for example.

Thus, in some embodiments, signals may be passed between memory integrated circuits using electromagnetic radiation. However, signals may also be passed through interconnections in the form of connectors 13. The connectors 13, in some embodiments, may carry power and ground planes. In other embodiments, interconnections may provide other signals. In some embodiments, these connectors 13 may be implemented through integrated circuit connectors, such as solder balls, pins, wire bonds, and lands, to mention a few examples.

In some embodiments, the signals passing between the distributed memory integrated circuits 10 use near field electromagnetic technology via loop antennas to eliminate the need for direct electrical contact in providing inter die communication. Serial data links using the over-the-air transmission may be responsible for delivery and/or verifying that correct data was transmitted from, for example, a memory controller, to any of the devices within the array. Support to detect errors or loss data triggers retransmission until the data is verified as being correct and received completely in one embodiment.

Thus, in one embodiment, a memory controller may be placed relatively centrally within the array to facilitate communication with the other devices. Information transmitted from the memory controller in the center of the array, in one embodiment, may be transferred bucket brigade style throughout the array from device to device.

Referring to FIG. 2, the array, shown in FIG. 1, also has a depth into the page, in one embodiment, and includes a plurality of devices connected by connectors 13 and coupled by loop antennas 12. Particularly, as an example, the near field antennas 12c and 12f are coupled between adjacent devices in the same planar level of the stack shown in FIG. 1. Thus, an antenna 12f on the long dimension "L" of a memory integrated circuit 10 is coupled to an antenna 12c on the opposing long dimension of an adjacent memory integrated circuit. Likewise, antennas 12e and 12d communicate between adjacent neighbors along the short sides "W" of adjacent end-to-end memory integrated circuits 10.

As depicted in FIG. 2, the length of the memory integrated circuit packages L and the width W is substantially greater than the spacing between adjacent integrated circuits indicated as S.

Roughly speaking, the near field is a region within a radius R, much less than the wavelength, while the far field is in the region where the radius R is much greater than the wavelengths. Near field may also sometimes be called near zone. Generally, the near field is part of the radiated field that is below distances greater than $S=D2/(4\lambda)$ times the Fresnel parameter from the source of the diffracting edge or antenna of longitude of diameter D. The near field is separated from the far field by the Fresnel region.

Thus, by choosing the appropriate wavelength, the loop antenna systems may be tuned so that they are effectively keyed to the distance S between adjacent integrated circuits, reducing interference between from widely spaced antennas.

Referring to FIG. 3, in accordance with one embodiment, a memory integrated circuit, such as the circuit 10a, may include a plurality of connectors. In this case, the connectors that correspond to the connectors 13, shown in FIG. 2, may be implemented by solder balls 22, as one example. Each of the antennas 12 may be formed by a plated or printed conductive strip on or over an upper surface of a substrate 16, coupled to a via extending through the substrate 16, coupled to an internal conductive plated layer in one embodiment. Thus, a generally U-shaped loop antenna, such as the loop antennas 12c, 12d, 12e, and 12f, shown in FIG. 3, may be formed within the substrate 16.

In some embodiments, the substrate 16 may be formed of multiple layers 36 and 38, shown in FIG. 4, so that the plated conductors 34 may be covered by overlying material 36 and 38. The substrate 16 may be formed of a suitable dielectric material.

Referring back to FIG. 3, on the upper surface of the substrate 16, a loop antenna 12a may be formed and on the lower surface (not shown in FIG. 3) a loop antenna 12b may be formed. The loop antennas 12a and 12b may be simply plated, printed, or deposited on the upper surface between the antennas 12f, 12e, 12c, and 12d and an integrated circuit chip 18 in one embodiment. The integrated circuit chip 18 may be coupled by wire bonds 20 to the various loop antennas.

Thus, referring to the cross-sectional depiction in FIG. 4, it can be seen that, in one embodiment, a given loop antenna, such as the loop antenna 12d, is made up of a plating 30, coupled by vias 32 to plating 34 between substrate 16 portions 36 and 38. The portion 36 may be formed after deposition of the plating 38.

Figure 5:
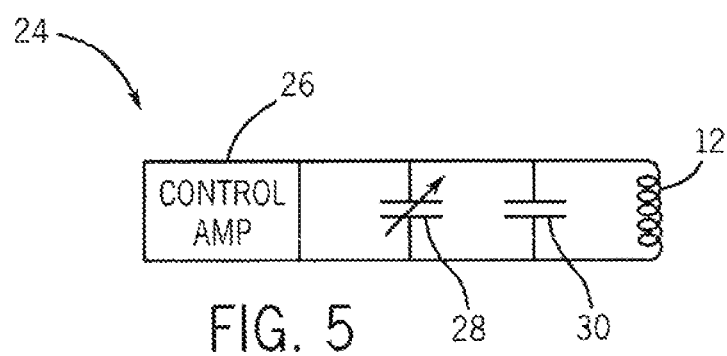
FIG. 5 is a circuit schematic for one embodiment of the present invention.

Referring to FIG. 5, in some embodiments, the integrated circuit 14 may include a control to control the transmission of electromagnetic energy from the loop antenna 12, illustrated as an inductor in FIG. 5. A control and power amplifier 25 may be coupled to parallel capacitors 28 and 30, which constitute the internal transceiver capacitances. One of the capacitances 28, in one embodiment, may be tunable so that the frequency at which the antenna transmits or receives may be altered. A suitable tunable capacitor may be implemented using any conventional technology. One technique for forming tunable capacitors is to use barium strontium titanate ferroelectric material as the dielectric material between two plates of an integrated circuit capacitor. The dielectric constant of the barium strontium titanate dielectric and, therefore, the capacitance value of the capacitor, can be adjusted by applying a DC voltage.

Thus, in some embodiments, a tunable frequency transmitter and receiver may be provided. This may be useful in a number of different situations. In one situation, depending on fabrication variations, it may be desirable to tune the frequency of the resulting device. However, in addition, it may be desirable that different devices, within the array, transmit using different frequencies interference. For example, in one embodiment, all of the devices within a given plane or level of the array may be use a first frequency, while the devices in the level above and the level below use a second frequency. Thus, each device may be programmed to use a particular frequency at all times or may be varied from time to time in order to reduce interference.

In addition, two different types of devices with two different fixed frequencies can also be used and the stack may be made up appropriately to reduce interference. That is, the array may be arranged so that devices that are most likely to cause interference communicate with different frequencies.

For example, within a given integrated circuit, the upper and lower loop antennas may be operated at different frequencies to reduce interference. Then they can be matched with neighboring devices that have the same frequencies with which to communicate. In some embodiments, more than two different frequencies may be provided.

The vertical vias 32 through the substrate 16 may be completed, in one embodiment, by drilling holes into molded material forming the substrate 20, and filling the vias with solder paste, electrically conductive adhesive, or any other electrically conductive materials. Alternatively, solder or metal pillars may be in place prior to the molding process, where a grinding process on the finished mold exposes a metal for electrical pads.

By now it should be apparent that embodiments of the present invention allow increased memory storage efficiencies by using features, either singlely or in combination, that allow data to be reliably transferred in a distributed memory system using near field coupling. The wireless interface provides a method of uploading code and transferring data in inter died communication, while maintaining the maximum allowable data rate.

While certain features of the invention have been illustrated and described herein, many modifications, substitutions, changes, and equivalents will now occur to those skilled in the art. It is, therefore, to be understood that the appended claims are intended to cover all such modifications and changes as followed in the true spirit of the invention.

What is claimed is:

1. An apparatus comprising:
   a substrate having an upper surface, a lower surface opposite the upper surface, and a plurality of side surfaces perpendicular to and extending between the upper surface and the lower surface;
   an upper loop antenna on the upper surface;
   a lower loop antenna on the lower surface; and
   a plurality of loop antennas, each loop antenna of the plurality of loop antennas parallel to a respective side surface of the plurality of side surfaces and transversely oriented to the upper loop antenna and the lower loop antenna, the loop antenna comprising:
     a first portion of the loop antenna on the upper surface;
     a second portion of the loop antenna on the lower surface; and
     a via coupling the first portion of the loop antenna to the second portion of the loop antenna.

2. The apparatus of claim 1, wherein each loop antenna of the plurality of loop antennas comprises:
   a third portion of the loop antenna on the upper surface; and
   a second via coupling the third portion of the loop antenna to the second portion of the loop antenna.

3. The apparatus of claim 2, wherein the first and third portions comprise conductive strips plated or printed on the upper surface.

4. The apparatus of claim 2, wherein the second portion comprises an internal conductive layer plated or printed on the lower surface.

5. The apparatus of claim 1, further comprising an integrated circuit chip located on the upper surface and configured to control the upper loop antenna, the lower loop antenna, and the plurality of loop antennas.

6. The apparatus of claim 5, wherein the integrated circuit chip is at least partially surrounded by the upper loop antenna.

7. An apparatus comprising:
   an array of memory integrated circuits, wherein each memory integrated circuit comprises:
     a substrate having top face, a bottom face opposite the top face, and a plurality of side faces perpendicular to and extending between the top face and the bottom face;
     a first loop antenna within the substrate and adjacent to the top face;
     a second loop antenna within the substrate and adjacent to the bottom surface; and
     a plurality of side loop antennas, each side loop antenna of the plurality of side loop antennas having a first portion within the top face of the substrate and a second portion within the bottom face of the substrate, the first portion electrically coupled to the second portion, wherein each of the plurality of side loop antennas is adjacent to and parallel to a side face of the plurality of side faces and is transversely oriented to the first loop antenna and the second loop antenna.

8. The apparatus of claim 7, wherein a first memory integrated circuit of the array is communicatively coupled to a second memory integrated circuit of the array by near field communication.

9. The apparatus of claim 8, wherein a single loop antenna of the first memory integrated circuit is communicatively coupled to a single loop antenna of the second memory integrated circuit.

10. The apparatus of claim 9, wherein the single loop antenna of the first memory integrated circuit is parallel to the single loop antenna of the second memory integrated circuit.

11. The apparatus of claim 8, wherein the first memory integrated circuit is physically coupled to the second memory integrated circuit.

12. The apparatus of claim 7, wherein the first loop antenna and the second loop antenna are each perpendicular to each of the side loop antennas.

13. The apparatus of claim 7, wherein each memory integrated circuit in the array of memory integrated circuits comprises an integrated circuit chip located on the top face and surrounded by the first loop antenna.

14. An apparatus comprising:
   a substrate having a plurality of orthogonal faces, including a top face and a bottom face positioned opposite the top face;
   an upper loop antenna proximate the top face;
   a lower loop antenna proximate the bottom face;
   a plurality of loop antennas, wherein each loop antenna of the plurality of loop antennas is located adjacent to and parallel to one of the plurality of orthogonal faces, at least one of the plurality of loop antennas comprising a first portion proximate the top face and a second portion proximate the bottom face, the first portion electrically coupled to the second portion, wherein each loop antenna of the plurality of loop antennas is transversely oriented relative the upper loop antenna and the lower loop antenna; and
   an integrated circuit chip configured to control transmission of information from the plurality of loop antennas.

15. The apparatus of claim 14, wherein the integrated circuit chip is located on one face of the plurality of orthogonal faces.

16. The apparatus of claim 14, wherein the integrated circuit chip is located within a loop antenna of the plurality of loop antennas.

17. The apparatus of claim 14, wherein the integrated circuit chip is coupled to each loop antenna of the plurality of loop antennas by a wire bond.

18. The apparatus of claim 14, wherein each face in the plurality of orthogonal faces is perpendicular to each adjacent face of the plurality of orthogonal faces.

19. The apparatus of claim 14, wherein each loop antenna of the plurality of loop antennas is configured to communicate with a corresponding loop antenna in a neighboring apparatus by near field coupling.

* * * * *